(12) United States Patent
Yoon et al.

(10) Patent No.: US 7,687,818 B2
(45) Date of Patent: Mar. 30, 2010

(54) SEMICONDUCTOR LIGHT EMITTING DEVICE

(75) Inventors: Sang Ho Yoon, Gyunggi-do (KR); Su Yeol Lee, Gyunggi-do (KR); Doo Go Baik, Gyunggi-do (KR); Seok Beom Choi, Seoul (KR); Tae Sung Jang, Gyunggi-do (KR); Jong Gun Woo, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 56 days.

(21) Appl. No.: 12/177,517

(22) Filed: Jul. 22, 2008

(65) Prior Publication Data

US 2009/0026478 A1    Jan. 29, 2009

(30) Foreign Application Priority Data

Jul. 23, 2007    (KR)    ...................... 10-2007-0073494

(51) Int. Cl.
*H01L 33/00* (2006.01)
(52) U.S. Cl. .................... 257/98; 257/99; 257/E33.072
(58) Field of Classification Search .................. 257/98, 257/99, E33.072
See application file for complete search history.

(56) References Cited

U.S. PATENT DOCUMENTS 6,784,462 B2    8/2004    Schubert
7,564,071 B2 *  7/2009    Konno ......................... 257/98

* cited by examiner

*Primary Examiner*—Thien F Tran
(74) *Attorney, Agent, or Firm*—McDermott Will & Emery LLP

(57) ABSTRACT

There is provided a semiconductor light emitting device having excellent light extraction efficiency to efficiently reflect light moving into the device by increasing the total reflectivity of a reflective layer. A semiconductor light emitting device according to an aspect of the invention includes: a substrate, a reflective electrode, a first conductivity semiconductor layer, an active layer, and a second conductivity type semiconductor layer that are sequentially stacked. Here, the reflective electrode includes; a first reflective layer provided on the substrate and including a conductive reflective material reflecting light generated from the active layer; and a second reflective layer provided on the first reflective layer, including one or more dielectric portions reflecting light generated from the active layer, and one or more contact holes filled with a conductive filler to electrically connect the first conductivity type semiconductor layer and the first reflective layer, and having a greater thickness than a wavelength of the generated light.

11 Claims, 8 Drawing Sheets

US 7,687,818 B2

SEMICONDUCTOR LIGHT EMITTING DEVICE

CROSS-REFERENCE TO RELATED APPLICATIONS

This application claims the priority of Korean Patent Application No. 2007-0073494 filed on Jul. 23, 2007, in the Korean Intellectual Property Office, the disclosure of which is incorporated herein by reference.

BACKGROUND OF THE INVENTION

1. Field of the Invention

The present invention relates to semiconductor light emitting devices, and more particularly, to a semiconductor light emitting device that has excellent light extraction efficiency to effectively reflect light moving into the device by increasing the total reflectivity of a reflective layer, and can prevent an increase in operating voltage by maintaining an effective light emitting area and increasing the reflectivity of the reflective layer.

2. Description of the Related Art

In general, semiconductor light emitting devices include semiconductor materials that emit light. For example, light emitting diodes (LEDs) have semiconductor junctions using diodes to convert energy generated by recombination of electrons and holes into light and emit the generated light. The semiconductor light emitting devices are being widely used as lighting, display devices, and light sources. In consideration of energy savings and the protection of environment, the development of semiconductor light emitting devices has been expedited in that they can emit light having desired wavelength with low power consumption and prevent emission of environmental hazardous substances such as mercury.

In particular, the widespread use of cellular phone keypads, side viewers, and camera flashes, which use gallium nitride (GaN)-based light emitting diodes that have been actively developed and widely used in recent years, contributes to the active development of general lighting that uses light emitting diodes. Applications of the light emitting diodes, such as backlight units of large TVs, headlights of cars, and general lighting, have advanced from small portable products to large products having high power, high efficiency, and high reliability. Therefore, there has been a need for light sources having characteristics that satisfy corresponding products.

FIG. 1 is a cross-sectional view illustrating a semiconductor light emitting device 1 according to the related art. In FIG. 1, in the semiconductor light emitting device 1, a reflective electrode 20 is formed on a substrate 10.

The semiconductor light emitting device 1 includes the substrate 10, a first conductivity type semiconductor layer 30, a second conductivity type semiconductor layer 50, and an active layer 40 formed between the first and second conductivity type semiconductor layers 10 30 and 50 to generate light. The first and second conductivity type semiconductor layers 30 and 50 are different conductivity type semiconductor layers. Further, the reflective electrode 20 is provided between the substrate 10 and the first conductivity type semiconductor layer 30.

The semiconductor light emitting device 1, shown in FIG. 1, is designed so that light generated from the active layer 40 is extracted toward the second conductivity type electrode 60. However, when a voltage is applied to the second conductivity type semiconductor layer 50, the first conductivity type semiconductor layer 30, and the active layer 40, and a current flows therethrough, light is generated in an omni-direction at a predetermined point of the active layer 40 and moves.

Therefore, when the light moves in an undesirable direction, for example, if the actually generated light is not extracted to the outside of the semiconductor light emitting device 1 but moves toward the substrate 10, the light is lost inside the semiconductor light emitting device 1 and is not extracted. The reflective electrode 20 is provided so that light moving toward the substrate 10 that is an opposite direction to a light extraction direction is redirected and moves to the light extraction direction.

A vertical electrode-type LED that has a conductive support substrate opposite to the LED and does not have a sapphire substrate is more advantageous than a horizontal electrode-type LED that uses a non-conductive sapphire substrate in terms of electric resistance and heat generation during high-current operation. In order to improve efficiency of the vertical electrode-type LED, an irregular pattern that causes diffused reflection is formed at the surface to increase light extraction efficiency or reflectivity of the reflective electrode is increased to reduce absorption of light by the electrode.

Thus, the reflective electrode 20 is generally formed of Ag or Al that has high reflectivity with respect to visible rays (in particular, blue) and an excellent electrical characteristic to obtain good electric current flow. However, in order to manufacture an LED having high efficiency, the reflectivity needs to be increased more. Further, referring to FIG. 1, the reflective electrode 20 contains Ni 22 as well as Ag 21. Since Ag 21 has weak adhesion to the first conductivity type semiconductor layer 30, Ni 22 is used as an adhesive material. However, when Ni 22 is contained in the reflective electrode 20, Ni 22 absorbs light moving from the active layer 40 to reduce the reflectivity of the reflective electrode 20.

FIG. 2 is a graph illustrating reflectivity according to an incident angle in the reflective electrode of the semiconductor light emitting device, shown in FIG. 1. In FIG. 2, the reflectivity is measured using a reflective electrode included in a blue LED. Referring to FIGS. 1 and 2, it can be seen that the highest reflectivity is obtained when Ag 21 is only used. When Ni 22 is added because of the weak adhesion of Ag 21, the reflectivity according to the incident angle is reduced with increasing content of Ni 22.

Therefore, there has been a need for a method of improving the light extraction efficiency of a semiconductor light emitting device with ease at low cost.

SUMMARY OF THE INVENTION

An aspect of the present invention provides a semiconductor light emitting device that has excellent light extraction efficiency by increasing the total reflectivity of a reflective layer and effectively reflecting light moving into the light emitting device.

Another aspect of the present invention provides a semiconductor light emitting device that can prevent an increase in operating voltage by maintaining an effective light emitting area and increasing a reflective layer.

According to an aspect of the present invention, there is provided a semiconductor light emitting device including: a substrate; a stack having a first conductivity type semiconductor layer, an active layer, and a second conductivity type semiconductor layer sequentially stacked on the substrate; and a reflective electrode provided between the substrate and the stack to reflect light generated from the active layer.

Here, the reflective electrode includes a first reflective layer provided on the substrate and including a conductive reflective material reflecting light generated from the active layer;

and a second reflective layer provided on the first reflective layer, including one or more dielectric portions reflecting light generated from the active layer, and one or more contact holes filled with a conductive filler to electrically connect the first conductivity type semiconductor layer and the first reflective layer, and having a greater thickness than a wavelength of the generated light.

The first reflective layer may be formed of the conductive reflective material including Ag or Al having high reflectivity to reflect light. Further, the first reflective layer may include Ni, an adhesive conductive material, at a partial or entire surface thereof to improve adhesion between the conductive reflective material and another layer. The Ni content may be 10 wt % of the total weight of the first reflective layer in consideration of reflectivity of the first reflective layer.

The dielectric portions included in the second reflective layer may each have a thickness equal to or greater than a wavelength of light generated from the active layer, and preferably, a thickness of 2 μm or less. The dielectric portions may each have a lower refractive index than the second conductivity type semiconductor layer to reflect moving light. The dielectric portions may each be $SiO_2$ or SiN having a smaller refractive index than the second conductivity type semiconductor layer.

Any one of the dielectric portions may be located at a region of the second reflective layer, the region underlying the second conductivity type electrode. Any one of the dielectric portions may have an area equal to or greater than the second conductivity type electrode.

The conductive filler filling in the contact holes may be the same material as the conductive reflective material of the first electrode layer.

The substrate may be a vertically semiconductor light emitting device, and thus, may be a conductive substrate including any one of Ni, Cu, and Si.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art.

Figure 3:
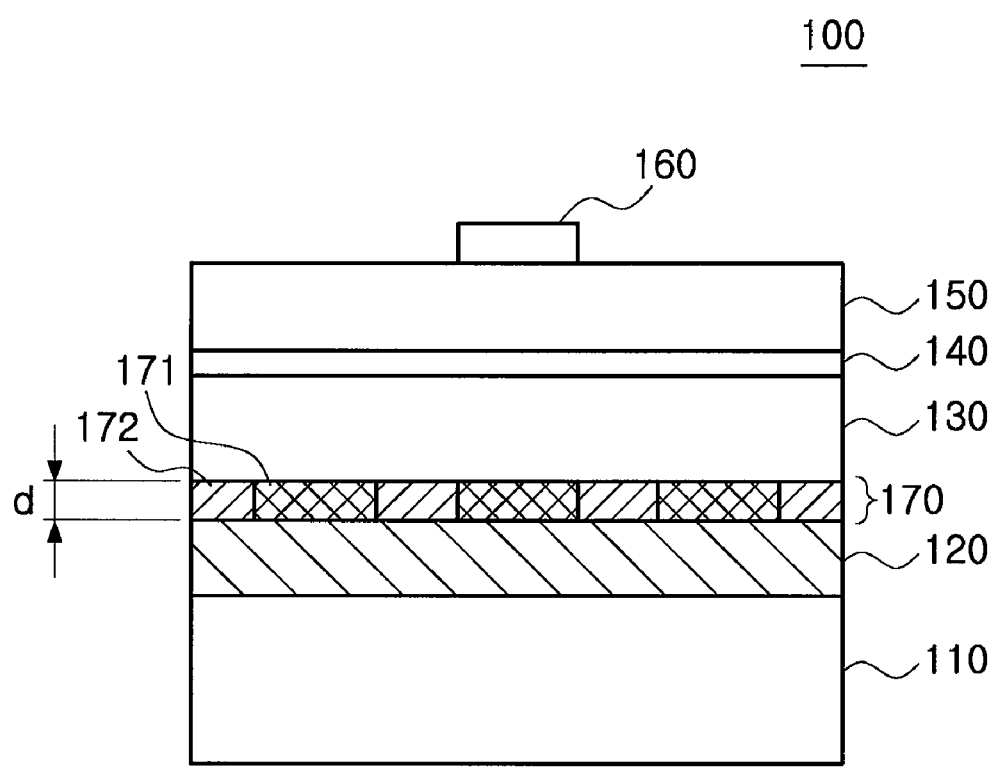
FIG. 3 is a cross-sectional view illustrating a semiconductor light emitting device according to an exemplary embodiment of the invention.

FIG. 3 is a cross-sectional view illustrating a semiconductor light emitting device according to an exemplary embodiment of the invention. In FIG. 3, the semiconductor light emitting device 100 according to the embodiment of the invention includes a substrate 110, a stack having layers 130, 140, and 150, and a reflective electrode having reflective layers 120 and 170. A first conductivity type semiconductor layer 130, an active layer 140, and a second conductivity type semiconductor layer 150 are sequentially stacked on the substrate 110 to form the multilayer stack. The reflective electrode is provided between the substrate 110 and the multilayer stack to reflect light generated from the active layer 140.

The substrate 110 may be a growth substrate for growing the multilayer stack or a support substrate for supporting the multilayer stack. A non-conductive substrate formed of sapphire or spinel ($MgAl_2O_4$) or a conductive substrate formed of SiC, Si, ZnO, GaAs, or GaN, including a metal substrate, may be used as the substrate 110. A conductive substrate formed of Ni, Cu or Si is used as a vertical semiconductor light emitting device.

The first conductivity type semiconductor layer 130, the active layer 140, and the second conductivity type semiconductor layer 150 are sequentially stacked on the substrate 110 to form the multilayer stack. Each of the first and second conductivity type semiconductor layers 130 and 150 is formed of a semiconductor, such as a GaN-based semiconductor, a ZnO-based semiconductor, a GaAs-based semiconductor, a GaP-based semiconductor, and a GaAsP-based semiconductor. The first and second conductivity type semiconductor layers 130 and 150 may be a p-type semiconductor layer and an n-type semiconductor layer, respectively. The semiconductor layers may be formed by using molecular beam epitaxy (MBE). Further, the semiconductor layers may be formed of a semiconductor selected from the group consisting of group III-V semiconductors, group II-VI semiconductors, and Si.

Impurities of the n-type semiconductor layer may be formed of, for example, Si, Ge, or Sn. Impurities of the p-type semiconductor layer may be formed of, for example, Mg, Zn, or Be.

Light emission is activated in the active layer 140. The active layer is formed of a material having a smaller energy band gap than each of the first conductivity type semiconductor layer 130 and the second conductivity type semiconductor layer 150. For example, when each of the first conductivity type semiconductor layer 130 and the second conductivity type semiconductor layer 150 is formed of a GaN-based compound semiconductor, the active layer 140 may be formed of an InGaN-based compound semiconductor that has a smaller energy band gap than the GaN-based compound semiconductor. Here, the active layer 140 is not doped with impurities in consideration of characteristics of the active layer 140. Wavelength or Quantum efficiency can be controlled by changing a height of a barrier, thickness and composition of a well layer, and the number of wells.

A second conductivity type electrode 160 is electrically connected to an external power supply so that a current is applied to the second conductivity type semiconductor layer 150. The second conductivity type electrode 160 may be formed of such metal as Pd or Au. In a case of a horizontal semiconductor LED, an electrode for the first conductivity type semiconductor layer 130 may be formed on the first conductivity type semiconductor layer 130. In a case of a vertical semiconductor LED, as shown in FIG. 3, the electrode may be electrically connected to the external power supply through the substrate 110.

The reflective electrode includes a first reflective layer 120 and a second reflective layer 170. The first reflective layer 120 is formed on the substrate 110 and is formed of a conductive reflective material that reflects light generated from the active layer 140. The second reflective layer 170 is formed on the first reflective layer 120. Further, the second reflective layer 170 includes at least one dielectric portion 171 that reflects light generated from the active layer 140, and at least one contact hole 172 that is filled with a conductive filler to electrically connect the first conductivity type semiconductor layer 130 and the first reflective layer 120 to each other. The second reflective layer 170 has a thickness d greater than a wavelength of the generated light.

In this embodiment of the invention, the reflective electrode includes the first reflective layer 120 that is a metal reflective layer generally used and the second reflective layer 170 that is formed of a dielectric material. The first reflective layer 120 is formed on the substrate 110 and is formed of a conductive reflective material, such as metal having high reflectivity, to reflect the light generated from the active layer 140. To this end, Ag or Al having relatively high reflectivity may be used to form the first reflective layer 120.

The second reflective layer 170 includes at least one dielectric portion 171 and at least one contact hole 172. The dielectric portion 171 is a reflector that includes a dielectric, is formed on the first reflective layer 120, and reflects the light generated from the active layer 140. Since the dielectric portion 171 has a lower refractive index than the first conductivity type semiconductor layer 130 formed on the second reflective layer 170, the dielectric portion 171 reflects light. The dielectric portion 171 is a dielectric having a refractive index smaller than the second conductivity-type semiconductor layer. For example, the dielectric portion 171 may be formed of a dielectric, such as $SiO_2$ or SiN.

The contact hole 172 is filled with the conductive filler to electrically connect the first conductivity type semiconductor layer 130 and the first reflective layer 120 to each other. Since the dielectric portion 171 is a dielectric, the dielectric portion 171 is electrically insulated. Therefore, to achieve electric conduction, the second reflective layer 170 needs a region through which an electric current flow is induced. The number of contact holes 172 can be appropriately changed according to the number of dielectric portions 171 and a necessary operating voltage.

Figure 1:
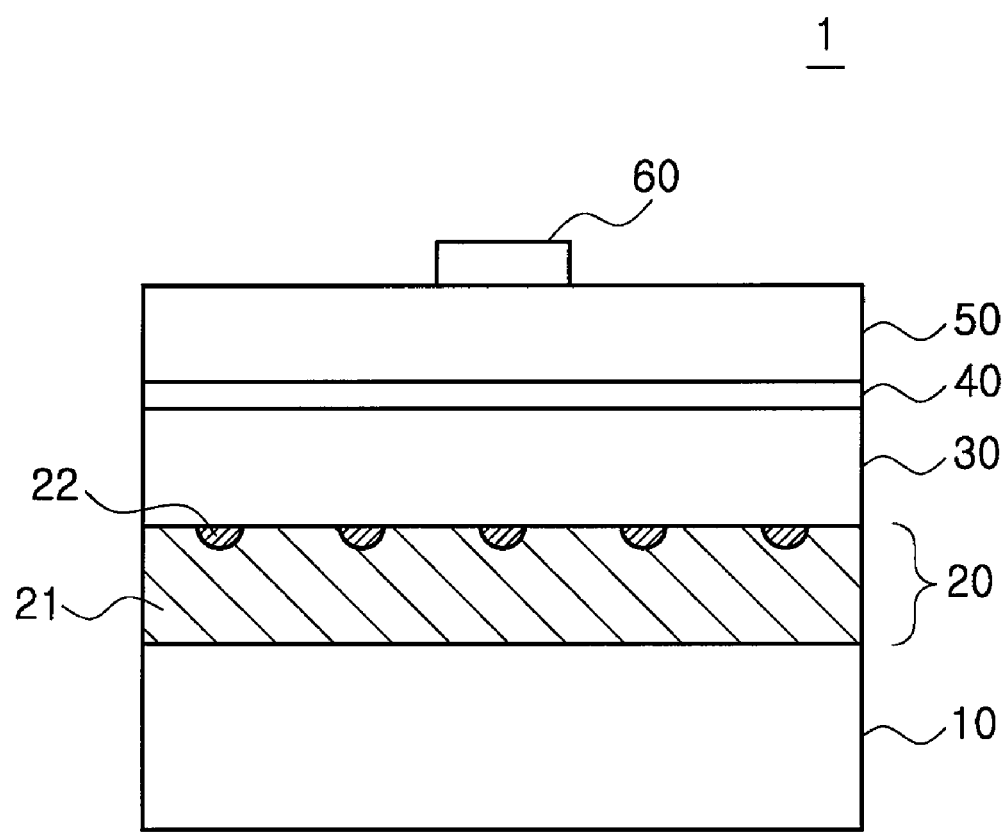
FIG. 1 is a cross-sectional view illustrating a semiconductor light emitting device having a reflective electrode on a substrate according to the related art.
Figure 2:
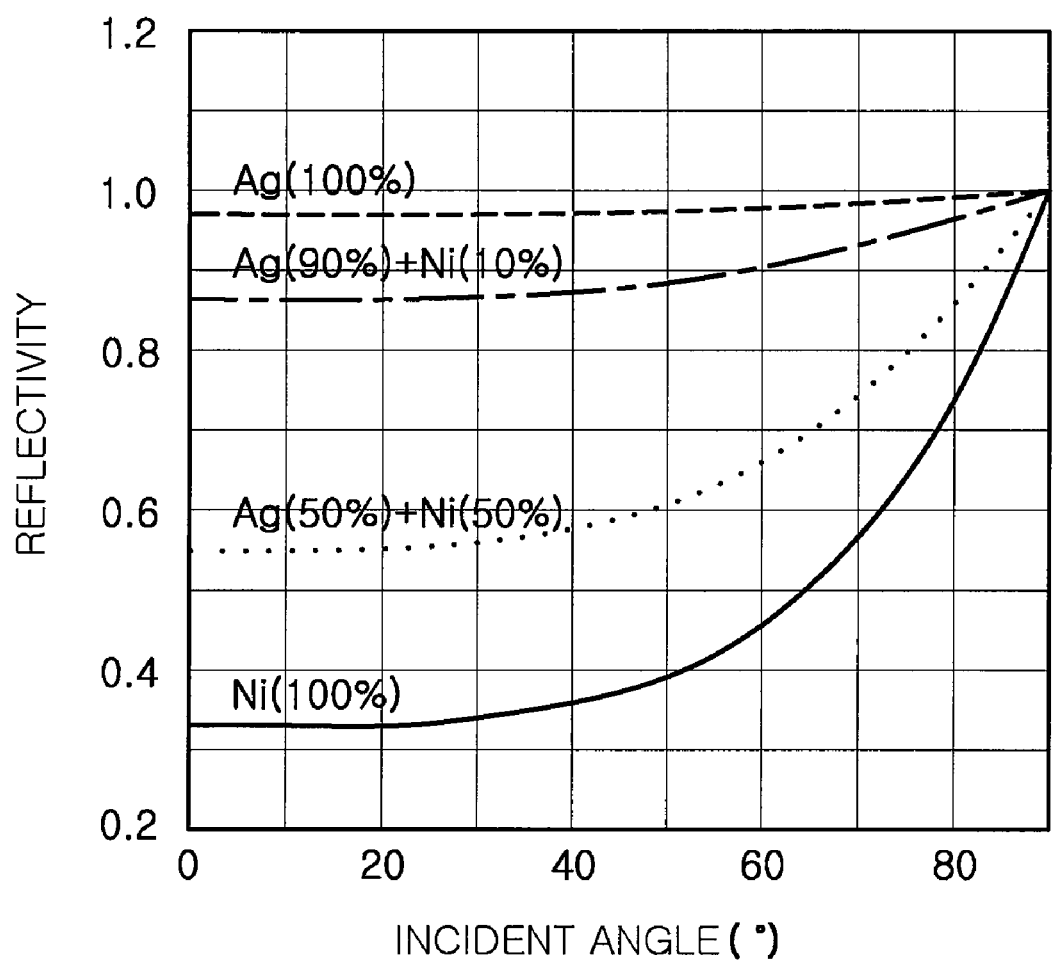
FIG. 2 is a graph illustrating reflectivity according to an incident angle in the reflective electrode of the semiconductor light emitting device, shown in FIG. 1.
Figure 4:
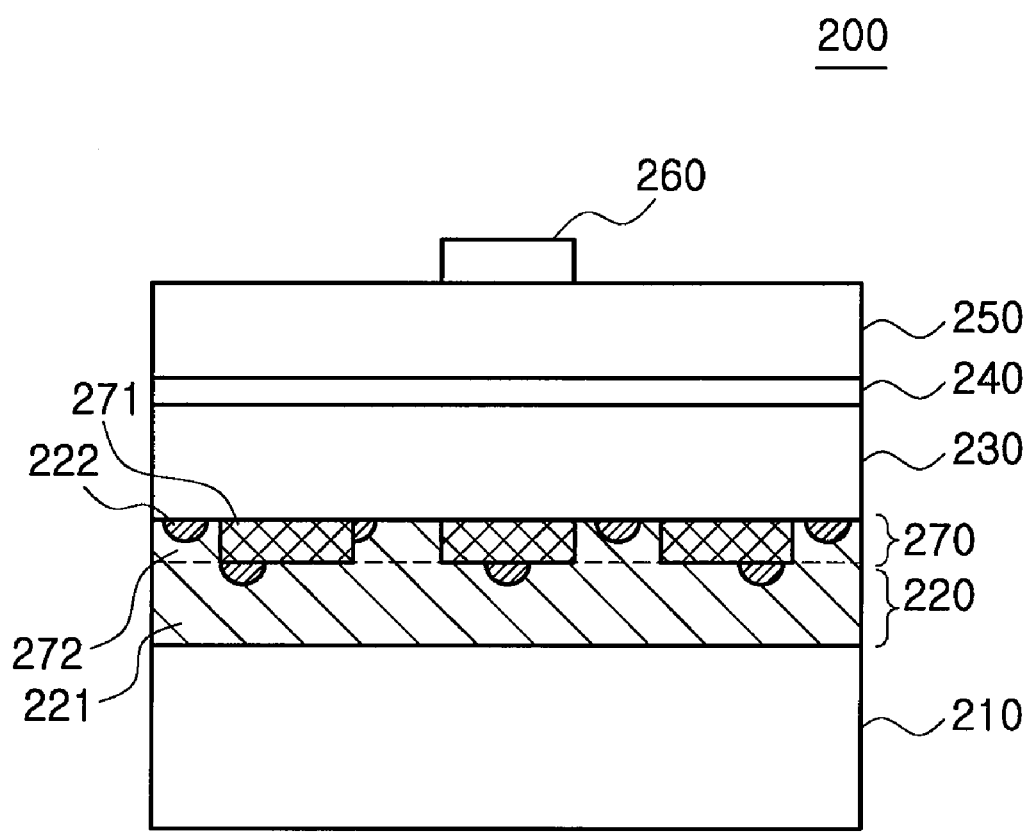
FIG. 4 is a cross-sectional view illustrating a semiconductor light emitting device according to another exemplary embodiment of the invention.

FIG. 4 is a cross-sectional view illustrating a semiconductor light emitting device 200 according to another exemplary embodiment of the invention. In the semiconductor light emitting device 200 according to this embodiment, shown in FIG. 4, contact holes 272 and a first reflective layer 120 are formed of the same metal. Since a substrate 210, a first conductivity type semiconductor layer 230, an active layer 240, a second conductivity type semiconductor layer 250, and a second conductivity type electrode 260 are the same as those in FIG. 1, a detailed description thereof will be omitted.

In FIG. 4, a reflective electrode having reflective layers 260 and 270 contains Ni, which is an adhesive conductive material 222, on a partial or entire surface in order to improve adhesion between the conductive reflective material 221 and another layer. A predetermined amount of Ni is contained in consideration of reflectivity and adhesion of the first reflective layer 220. Ni may be 10 wt % of the total weight of the first reflective layer 220. When Ni is less than 10 wt %, adhesion of the first reflective layer 220 may be decreased. On the other hand, when Ni is more than 10 wt %, it may have a significant effect on desired reflectivity of the first reflective layer 220.

A second reflective layer 270 includes three dielectric portions 271. Contact holes 272 filled with a conductive filler are formed between the respective dielectric portions 271. A conductive filler fills in the contact holes 272. The contact holes 272 filled with the conductive filler may be formed of a material different from that of the first reflective layer 220. As shown in FIG. 4, the contact holes 272 and the first reflective layer 220 may be formed of the same material by using the conductive reflective material 221. The adhesive conductive material 222 may be formed at the interface between the conductive reflective material 221 and the dielectric portions 271 or at the interface between the contact holes 272 and the first conductivity type semiconductor layer 230 to thereby complement the adhesion.

Referring to FIG. 3, the second reflective layer 170 induces constructive interference of light with respect to incident light in a perpendicular direction to reduce light absorption of the first reflective layer 120, thereby increasing the reflectivity. However, since light generated from the active layer 140 is not always incident perpendicular to the reflective electrode, the total reflectivity of light except for the normally incident light is induced at an angle equal to or greater than a critical angle.

The dielectric portion 171 needs to be thin enough to maximize the constructive interference. That is, the dielectric portion 171 has a thickness equal to a quarter of a wavelength of the normally incident light. However, the total reflectivity needs to be induced with respect to light, which is not the normally incident light. When the dielectric portion 171 has a small thickness to increase the constructive interference of the normally incident light, increased absorption of light may occur due to interaction between light and plasmons at a predetermined angle greater than a critical angle.

In particular, the above-described absorption occurs remarkably at Brewster angle at which parallel polarized light beams among light beams incident on the dielectric are all transmitted. Light transmitting the dielectric or an evanescent wave reaches the metal layer, that is, the first reflective layer 120 under the electric portion 171. Then, polaritons of the light from coupling of photons of the light with electrons in the metal layer are absorbed in the metal.

Therefore, in consideration of the above problem, preferably, the thickness d of the dielectric portion 171, that is, the second reflective layer 170 needs to be increased. In consideration of normally incident light and non-normally incident light, preferably, the second reflective layer 170 may have the thickness d greater than the wavelength of light. When the thickness d of the dielectric portion 171 is increased, a distance between the first reflective layer 120 and the light transmitting the dielectric portion 171 and the evanescent wave light becomes larger. As a result, the absorption of the light transmitting the dielectric portion 171 and the evanescent wave can be prevented. That is, even when light generated from the active layer 140 is incident at an angle greater than the critical angle, the interaction between the light and the plasmons can be reduced.

Figure 5:
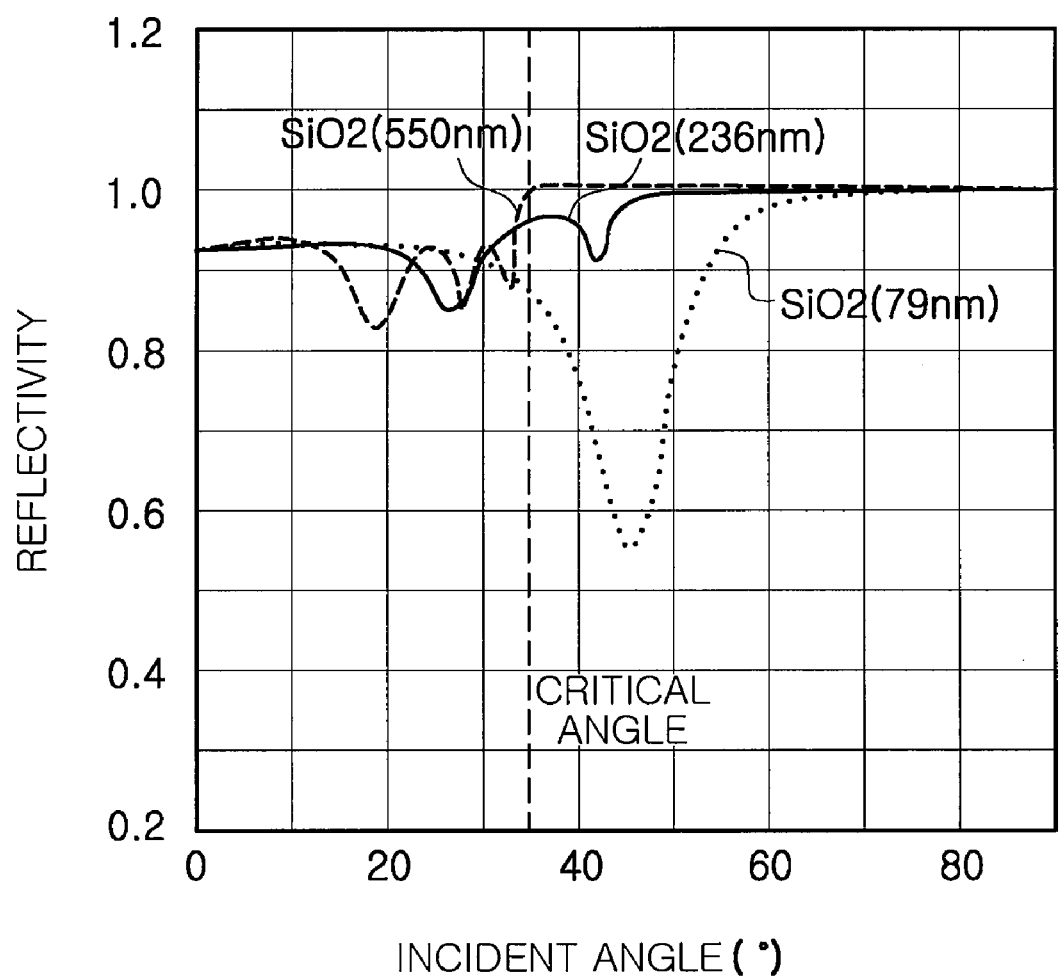
FIG. 5 is a graph illustrating reflectivity according to an incident angle by the thickness of a second reflective layer.
Figure 6:
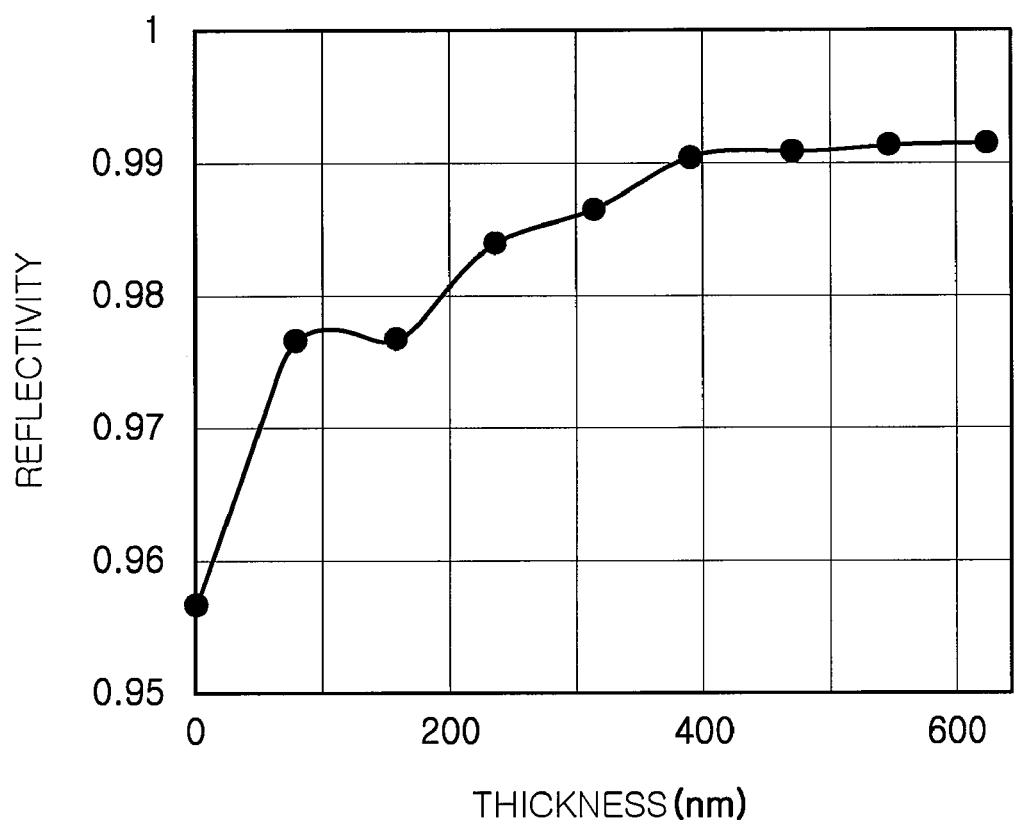
FIG. 6 is a graph illustrating reflectivity of a reflective electrode according to the thickness of the second reflective layer.

FIG. 5 is a graph illustrating reflectivity according to an incident angle by thickness of a second reflective layer. FIG. 6 is a graph illustrating reflectivity of a reflective electrode according to the thickness of the second reflective layer. Hereinafter, the description will be made with reference to FIGS. 1, 5, and 6.

In FIG. 5, reflectivity according to an incident angle is measured when the semiconductor light emitting device 100 is a blue LED and the dielectric portion 171 is formed of $SiO_2$. FIG. 5 is the graph showing reflectivity when the second reflective layer 170, that is, the thickness of the dielectric portion 171 is 79 nm, 236 nm, and 550 nm. First, when the dielectric portion 171 has a thickness of 79 nm, there is a sudden drop in reflectivity at an angle greater than a critical angle. However, when the dielectric portion 171 has a thickness of 236 nm, there is no sharp drop at the angle greater than the critical angle as observed when the dielectric portion 171 has a thickness of 79 nm. An increase in thickness of the dielectric portion 171, that is, the thickness of 236 nm leads to higher reflectivity than that of the thickness of 79 nm at the incident angle greater than the critical angle.

When the dielectric portion 171 has a thickness of 550 nm greater than a wavelength of blue light, high reflectivity is obtained at an incident angle greater than the critical angle. Therefore, the greater thickness the dielectric portion 171 has, the higher reflectivity is obtained at the incident angle greater than the critical angle.

FIG. 6 is a graph illustrating reflectivity according to the thickness of the second reflective layer 170, that is, the dielectric portion 171. In the graph of FIG. 6, the total reflectivity is calculated by integrating the reflectivity according to the thickness of the dielectric portion 171 in three dimensions. According to the calculation, as the thickness of the dielectric portion 171 approximates to a thickness (of approximately 500 nm) corresponding to the wavelength of blue light, the total reflectivity of 99% is obtained.

Therefore, preferably, the thickness of the dielectric portion included in the second reflective layer is equal to or greater than the wavelength of light generated from the active layer. However, the thickness is preferably 2 μm or less. This is because when the thickness of the dielectric portion 171 exceeds 2 μm, the dielectric portion 171 may be separated from the first conductivity type semiconductor layer 130.

Figure 7A:
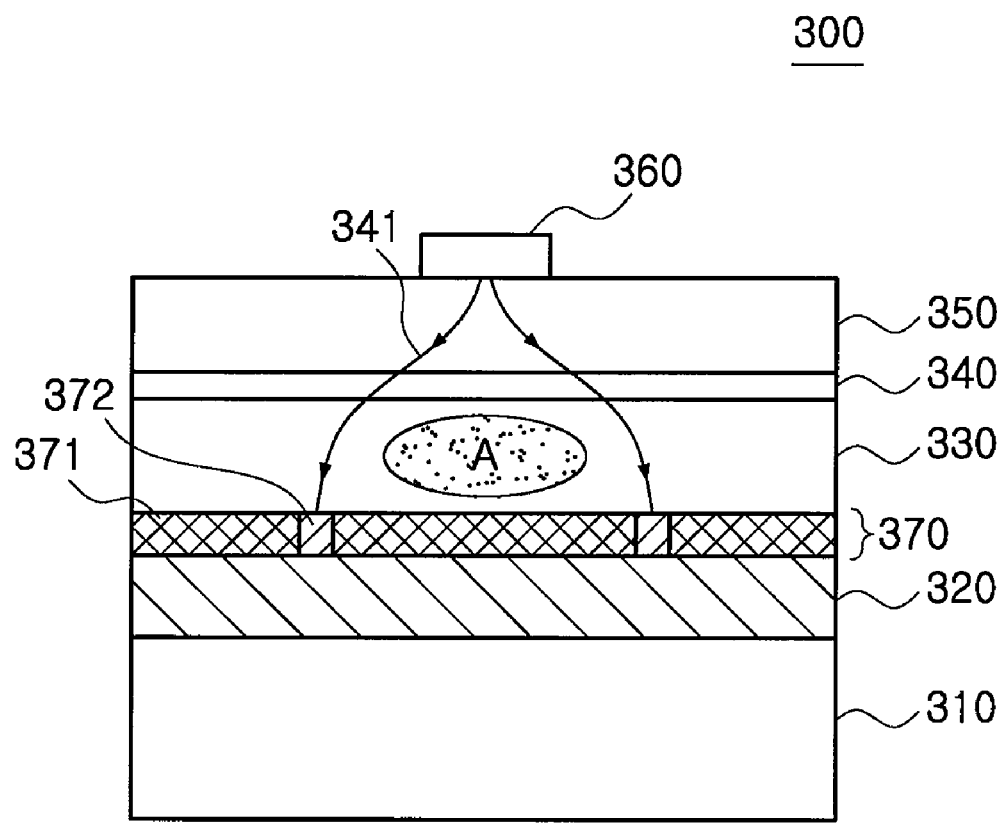
FIG. 7A is a view illustrating a current flow according to the size and position of the second reflective layer.
Figure 7B:
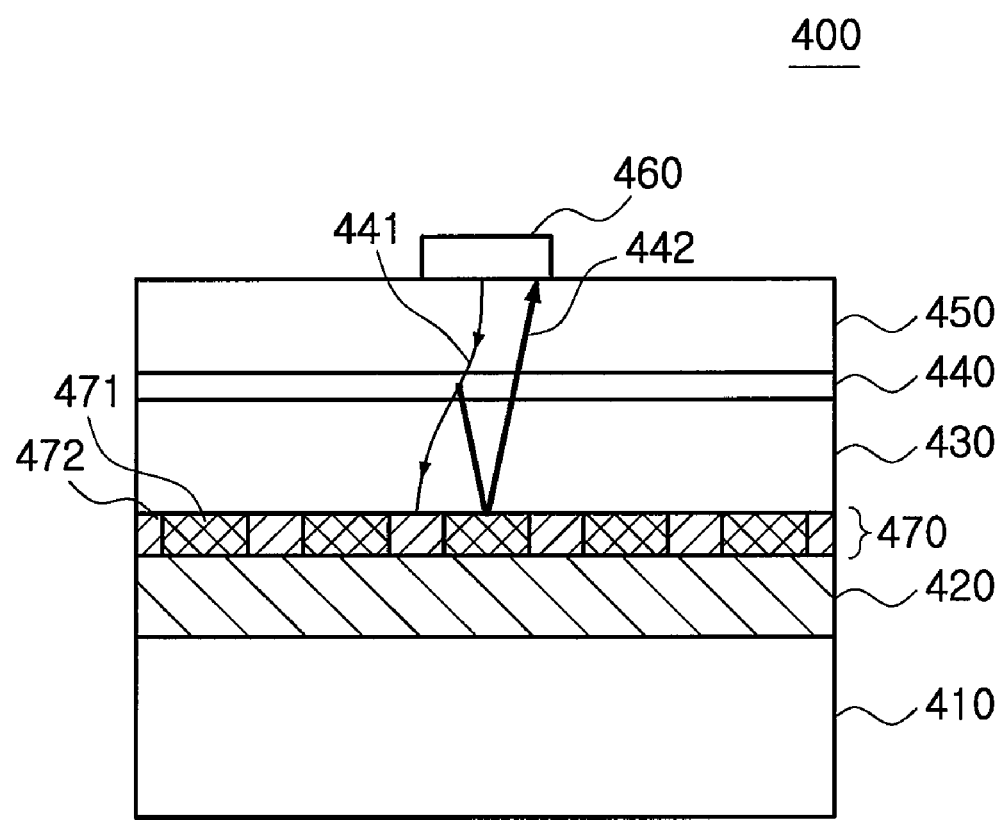
FIG. 7B is a view illustrating light extraction according to the size and position of the second reflective layer.

FIG. 7A is a view illustrating a current flow according to the size and position of the second reflective layer. FIG. 7B is a view illustrating light extraction according to the size and position of the second reflective layer. Since substrates 310 and 410, first conductivity type semiconductor layers 330 and 430, active layers 340 and 440, second conductivity type semiconductor layers 350 and 450, and second conductivity type electrodes 360 and 460 are the same as those in FIG. 1, a description thereof will be omitted.

Preferably, in the semiconductor light emitting device according to the embodiment of the invention, a dielectric portion or one of a plurality of dielectric portions is formed on a region of the second reflective layer that underlies the second conductivity type electrode. Further, preferably, any one of the dielectric portions has an area equal to or greater than that of the second conductivity type electrode.

In general, preferably, there is no object on a light extraction surface of the semiconductor light emitting device since the object may adversely affect light extraction. Referring to FIG. 7A, the second conductivity type electrode 360 is located on the second conductivity type electrode 360, which may adversely affect light extraction efficiency. In FIG. 7A, the dielectric portions 371 are located vertically under the second conductivity type electrode 360. Since a current does not flow through the dielectric portion 371, a current 341 flows through the contact holes 372 of the reflective layer 370. Therefore, preferably, the dielectric portion 371 underlies the second conductive electrode 360, increases reflectivity, and reduces the amount of light generated from a region of the active layer 340 between the second conductivity type electrode 360 and the second reflective layer 370.

Since the current does not flow through the dielectric portion 371, it is expected that the current is not sufficiently spread in a region A. The smaller the region A is, the better current spreading can be achieved.

Meanwhile, in FIG. 7B, the second reflective layer 470 has the dielectric portion 471 that has a smaller area than the second conductivity type electrode 460. At this time, light is emitted in a region of the active layer 440 that underlies the second conductivity type electrode 460. The emitted light is hidden by the second conductivity type electrode 460 and moves into the semiconductor light emitting device 400 again. Therefore, when the dielectric portion 471 has a smaller area than the second conductivity type electrode 460, light is emitted in the region underlying the second conductivity type electrode 460 to cause light loss, and thus light extraction efficiency may be adversely affected.

Therefore, preferably, an area of any one of the plurality of dielectric portions 371 that underlies the second conductivity type electrode 360 is almost the same as that of the second conductivity type electrode 360.

As set forth above, the semiconductor light emitting device according to the exemplary embodiment of the invention has excellent light extraction efficiency. In the semiconductor light emitting device, a dielectric layer having a thickness equal to or greater than a wavelength of light is formed and used as a reflective electrode together with a metal reflective layer, such that the total reflectivity of the reflective layer is increased to effectively reflect light moving into the device.

Further, the semiconductor light emitting device according to the embodiment of the invention can maintain an effective light emitting area and increase the reflectivity of the reflective layer to thereby prevent an increase in operating voltage.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   a substrate;
   a stack having a first conductivity type semiconductor layer, an active layer, and a second conductivity type semiconductor layer sequentially stacked on the substrate; and
   a reflective electrode provided between the substrate and the stack to reflect light generated from the active layer, the reflective electrode comprising;
   a first reflective layer provided on the substrate and including a conductive reflective material reflecting light generated from the active layer; and
   a second reflective layer provided on the first reflective layer, including one or more dielectric portions reflecting light generated from the active layer, and one or more contact holes filled with a conductive filler to electrically connect the first conductivity type semiconductor layer and the first reflective layer, and having a greater thickness than a wavelength of the generated light.

2. The semiconductor light emitting device of claim 1, wherein the conductive reflective material is Ag or Al.

3. The semiconductor light emitting device of claim 1, wherein the first reflective layer includes Ni at a partial or entire surface thereof.

4. The semiconductor light emitting device of claim 3, wherein the Ni content is 10 wt % of the total weight of the first reflective layer.

5. The semiconductor light emitting device of claim 1, wherein the dielectric portions each have a thickness of 2 μm or less.

6. The semiconductor light emitting device of claim 1, wherein the dielectric portions each have a lower refractive index than the second conductivity type semiconductor layer.

7. The semiconductor light emitting device of claim 1, wherein the dielectric portions each are $SiO_2$ or SiN.

8. The semiconductor light emitting device of claim 1, further comprising a second conductivity type electrode on the second conductivity type semiconductor layer,
wherein any one of the dielectric portions is located at a region of the second reflective layer, the region underlying the second conductivity type electrode.

9. The semiconductor light emitting device of claim 8, wherein any one of the dielectric portions has an area equal to or greater than the second conductivity type electrode.

10. The semiconductor light emitting device of claim 1, wherein the conductive filler filling in the contact holes is the same material as the conductive reflective material.

11. The semiconductor light emitting device of claim 1, wherein the substrate is a conductive substrate including any one of Ni, Cu, and Si.

* * * * *